United States Patent
McCarroll et al.

(10) Patent No.: US 7,387,958 B2
(45) Date of Patent: Jun. 17, 2008

(54) MMIC HAVING BACK-SIDE MULTI-LAYER SIGNAL ROUTING

(75) Inventors: Christopher P. McCarroll, Andover, MA (US); Jerome H. Pozgay, Marblehead, MA (US); Steven M. Lardizabal, Westford, MA (US); Thomas E. Kazior, Sudbury, MA (US); Michael G. Adlerstein, Wellesley, MA (US)

(73) Assignee: Raytheon Company, Waltham, MA (US)

( * ) Notice: Subject to any disclaimer, the term of this patent is extended or adjusted under 35 U.S.C. 154(b) by 322 days.

(21) Appl. No.: 11/177,732

(22) Filed: Jul. 8, 2005

(65) Prior Publication Data

US 2007/0020915 A1    Jan. 25, 2007

(51) Int. Cl.
*H01L 21/4763* (2006.01)
(52) U.S. Cl. .................. 438/622; 438/151; 257/621; 257/758; 257/778
(58) Field of Classification Search .............. 438/488, 438/6, 128, 129, 123, 598, 584, 618, 608, 438/609, 668, 599, 708, 734, 455–459, 597, 438/617, 460, FOR. 489, FOR. 211; 257/67, 257/68, 69, 347, 352, 353, 505, 507, 275, 257/374, E21.575, E29.01, E21.193, 621
See application file for complete search history.

(56) References Cited

U.S. PATENT DOCUMENTS

| | | | |
|---|---|---|---|
| 5,378,926 A | 1/1995 | Chi et al. | |
| 6,133,163 A | 10/2000 | Tanaka et al. | |
| 6,175,287 B1 | 1/2001 | Lampen et al. | |
| 6,214,630 B1 | 4/2001 | Hsuan et al. | |
| 6,245,663 B1 | 6/2001 | Zhan et al. | |
| 6,507,110 B1* | 1/2003 | Chai et al. | 257/728 |
| 2002/0140088 A1 | 10/2002 | Aoki et al. | |
| 2002/0140089 A1 | 10/2002 | Mimino et al. | |
| 2004/0009649 A1* | 1/2004 | Kub et al. | 438/459 |

FOREIGN PATENT DOCUMENTS

EP    0 436 912 A1    7/1991

OTHER PUBLICATIONS

PCT/US2006/021335 International Search Report dated Oct. 11, 2006.

(Continued)

*Primary Examiner*—Ha Nguyen
*Assistant Examiner*—Chakila Tillie
(74) *Attorney, Agent, or Firm*—Daly, Crowley, Mofford & Durkee, LLP (57) ABSTRACT

A method includes providing a single crystal wafer having MMIC chips. Each chip has an active device in a first surface portion of a semiconductor substrate provided by the wafer and an electrical interconnect having a first portion disposed on a second surface of the semiconductor substrate. The semiconductor substrate structure has a via therethrough, a second portion of the electrical interconnect passing though the via and being electrically connected to the active device. A multilayer interconnect structure is formed on the wafer providing a signal routing section on the second surface portion of a corresponding one of the chips. Each section has dielectric layers and an electrical conductor, such electrical conductor being electrically coupled to the active device to route an electrical signal to such active device. Each chip and the corresponding signal routing section are separated from the wafer.

10 Claims, 6 Drawing Sheets

OTHER PUBLICATIONS

S. Masuda, T. Hirose, S. Yokoawa, M. Nishi, S. Iijima, K Ono and Y Wantabe, A New Flip-Chip MMIC Technology With Multi-Layer Transmission Line Structure, 2001, pp. 118-121, Fujitsu Laboratories Ltd. Japan.

Manos M. Tentzeris, Joy Laskar, John Papapolymerou, Stephane Pinel, R. Li, G. Dejean, N. Papageorgiou, D. Thompson, R. Bairavasubramanian, S. Sarkar and J. -H. Lee, 3-D-Integrated RF and Millimeter-Wave Functions and Modules Using Liquid Crystal Polymer (LCP) System-on-Package Technology, May 2, 2004, pp. 332-340.

* cited by examiner

MMIC HAVING BACK-SIDE MULTI-LAYER SIGNAL ROUTING

TECHNICAL FIELD

This invention relates generally to monolithic microwave integrated circuits (MMICs) and more particularly to multi-layer signal routing used in such circuits.

BACKGROUND

As is known in the art, microwave monolithic integrated circuits (MMICs) have a wide range of applications. One application is in millimeter wave systems. Many of these millimeter wave systems are requiring higher and higher levels of circuit integration to achieve advanced performance and to fit into ever decreasing system size allocations. The problem that arises in achieving this new level of integration is the increased difficulty of connecting and/or interconnecting (also referred to as signal routing in this disclosure) to the functions that are now buried in the integrated circuitry. As a system example, the size of active phase array antenna systems is dictated by the spacing between antenna elements. This element spacing limits the maximum available area for putting the required circuitry for transmit and/or receive functions. As frequencies reach into the millimeter waves this area decreases to the point where conventional system architectures such as transmit/receive (T/R) modules in sealed packages are not feasible. Open architectures of integrated MMICs and even integrated sub-arrays become the only alternative and hence the problem of interconnecting functions. To put this size constraint in perspective the half-wave element spacing at 30 GHz is on the order of 0.210 inches and at 90 GHz is 0.070 inches. Just fitting the minimal functionality in this available space is very challenging. The minimal circuitry in this case consists of low noise amplification (LNA) and phase/amplitude setting circuits for receive and power amplification (PA) and phase/amplitude setting circuits for transmit. The interconnection or routing of signals and their associated connections occupy precious space that may lead to compromises in system.

One technique used for routing signals and controls around microwave modules and subsystems is with multi-layer printed circuit boards. More particularly, gallium arsenide MMICs are integrated onto these boards through either front-side wire bonds (face up MMIC) or front-side bumps (flipped MMIC) or back-side bumps through Direct to Back-side Interconnect (D-Bit). Today's standard wafer processing provides the capability for back-side metal patterning for wafer saw streets as well as isolated signal pads.

SUMMARY

In accordance with the present invention, a method is provided for forming a semiconductor structure. The method includes providing a single crystal wafer, such wafer having a plurality of MMIC chips, each one of the chips having an active device formed in a first surface portion of a semiconductor substrate provided by the wafer and an electrical interconnect having a first portion thereof disposed on a second surface portion of the semiconductor substrate. The semiconductor substrate structure has a via therethrough, a second portion of the electrical interconnect passes though the via and is electrically connected to the active device. The method includes forming a multilayer interconnect structure on the wafer, such multilayer interconnect structure having a plurality of signal routing sections, each one of the signal routing sections being formed on the second surface portion of a corresponding one of the chips. Each one of the sections has a plurality of dielectric layers and a plurality of electrical conductors, at least one of such electrical conductors being electrically coupled to the active device to route an electrical signal to such active device. The method includes separating each one of the plurality of chips and the corresponding one of the signal routing sections from the wafer.

In one embodiment, the multilayer interconnect structure is formed with the electrical conductors and dielectric layers providing a thermal conductor between a region exterior of the wafer and a region in thermal contact with the active device.

In one embodiment, the multilayer interconnect structure is formed with the electrical conductors and dielectric layers to provide a ground plane portion of a microwave transmission circuit for coupling microwave energy to or from the active device.

In one embodiment, the multilayer interconnect structure method comprises forming and processing the plurality of electrical conductors and dielectric layer on the wafer while the plurality of electrical conductors and dielectric layers are disposed on the second surface portion of the plurality of chips.

In one embodiment, the processing comprises a photolithographic process.

In one embodiment, the method includes: applying a layer of a conformal material over the first surface portion of the semiconductor wafer; disposing a single crystal support on the conformal material; and forming the multilayer interconnect structure on the second surface portion of the semiconductor wafer while supported by the single crystal support.

In one embodiment, the single crystal support is sapphire.

In one embodiment, the conformal material is wax.

With such an arrangement, enough room is provided to fit the required system functions in a given area and still be able to interconnect the functions. This is achieved through optimizing the space available on both the front-side and the back-side of an integrated MMIC that is fabricated on thin semiconductor wafers.

Thus, with the invention, the interconnection of compacted circuits to the system in terms of d.c. bias, digital control and r.f. connections are provided on the back-side (i.e., the side of the wafer opposite to the side used to formed active devices for the circuit). Hence, the invention provides a MMIC and MMIC process that takes advantage of the back-side of the integrated MMIC and allows routing of both controls and signals around the MMIC through multiplayer back-side processing.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
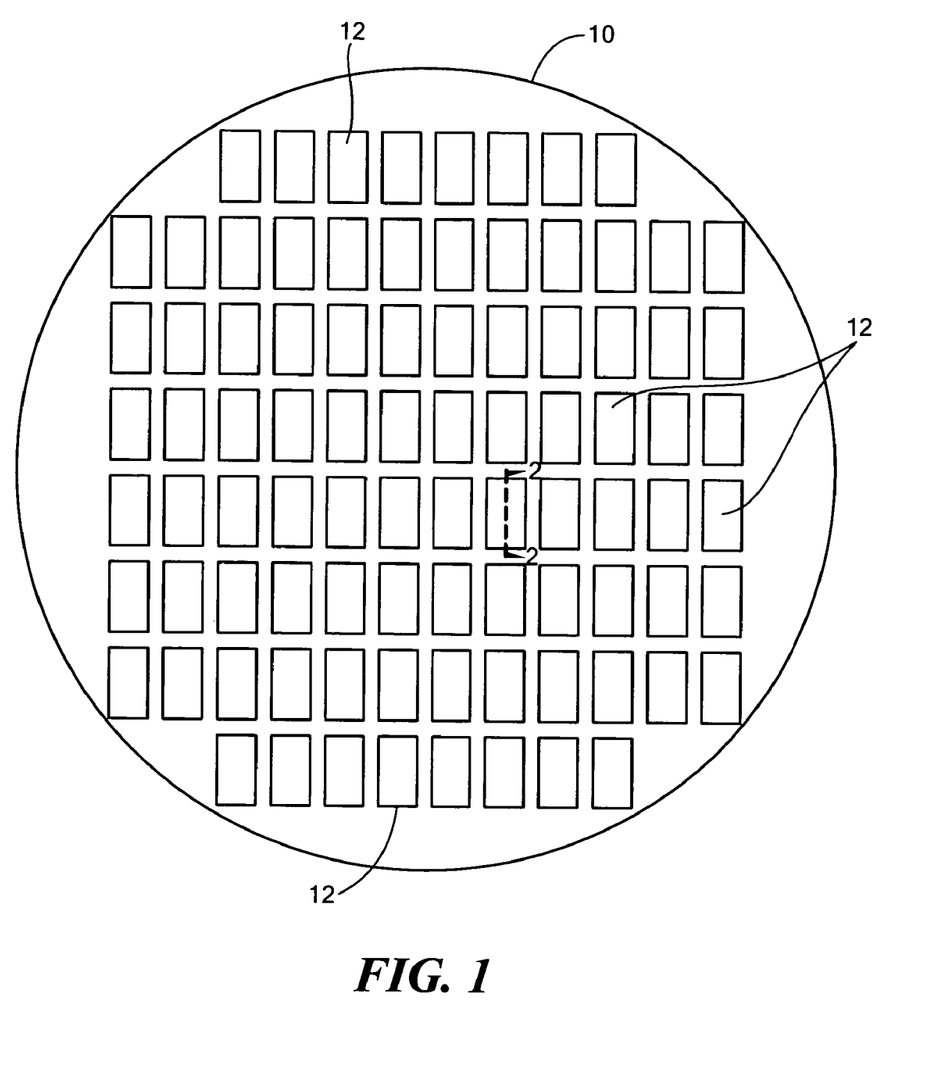
FIG. 1 is a semiconductor wafer having an array of regions therein.
Figure 2A:
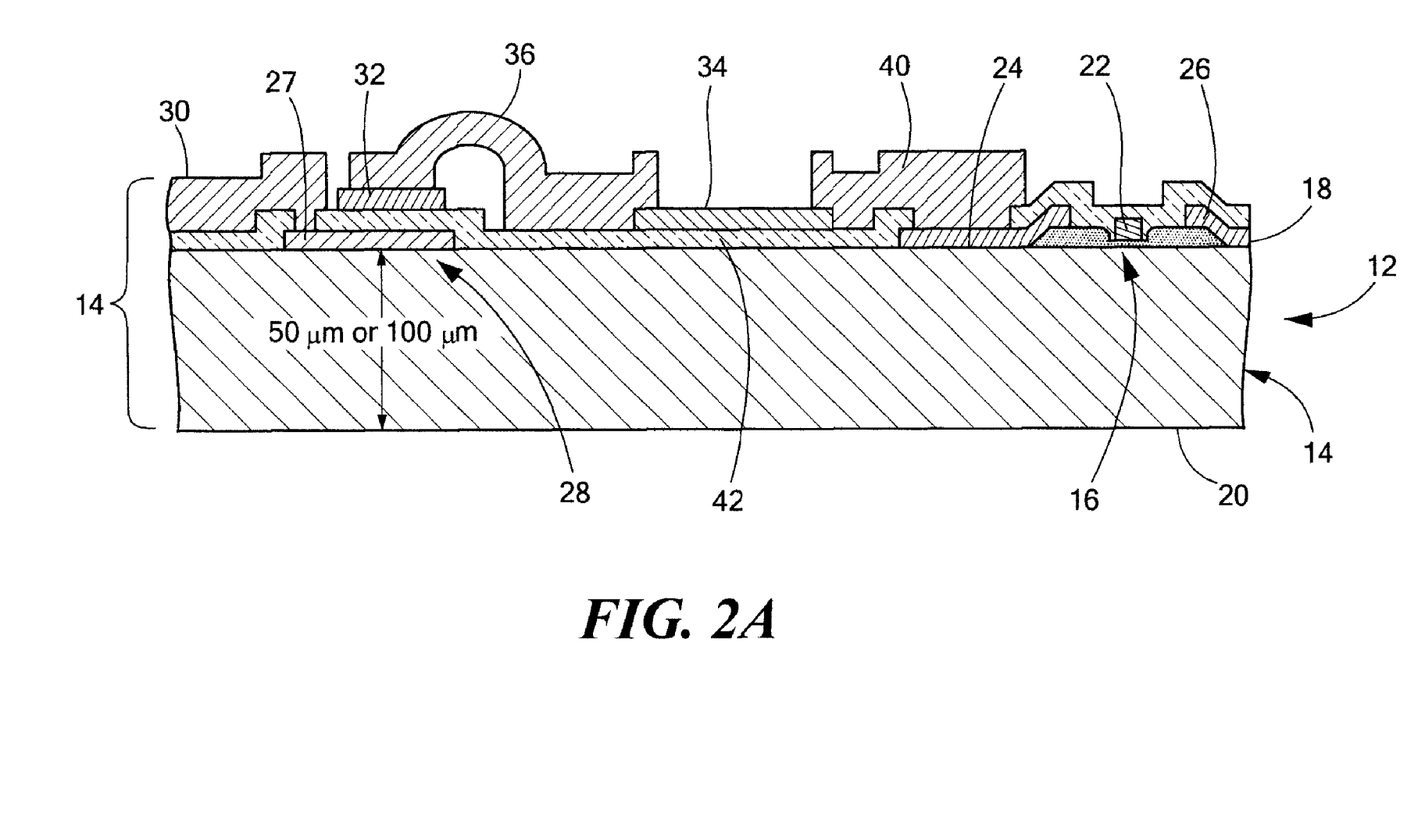
FIGS. 2A through 2D are cross sectional; sketch showing an exemplary one a plurality of semiconductor structures at various stages in the fabrication thereof in accordance with the invention, each one of the regions in the semiconductor wafer of FIG. 1 having therein such semiconductor structure, such cross section being taken along line 2-2 of FIG. 1.

Referring now to FIG. 1, a single crystal semiconductor wafer 10, here having a III-V wafer such as, for example, GaAs or InP, is shown. The wafer 10 has an array of regions 12. A cross-sectional sketch of an exemplary one of the regions 12 is shown in FIG. 2A. The region 12 includes providing a plurality of MMIC chips 14. The exemplary MMIC chip 14 shown in FIG. 2A has an active device 16 formed in a first, here upper-, top-, or front-side, surface portion 18 of a semiconductor substrate 20 provided by the wafer 10. The active device 16 is here a field effect transistor. The transistor has a gate electrode 22 and source/drain contacts connected to electrical conductors 24, 26. The bottom electrode 27 of a capacitor 28 is shown, connected to electrical conductor 30. The upper electrode 32 of the capacitor 28 is electrically connected to an electrically conductive pad 34 by interconnect 36. The electrical conductor 24 is also electrically connected to the conductive pad 34 through an electrical connector 40, as shown. A dielectric layer 42 is shown to provide the requisite electrical isolation. It shown be understood that the arrangement shown is only exemplary and other active devices and passive devices, not shown, may be included. The structure shown in FIG. 2A may be formed using any conventional front-side processing.

Figure 2B:
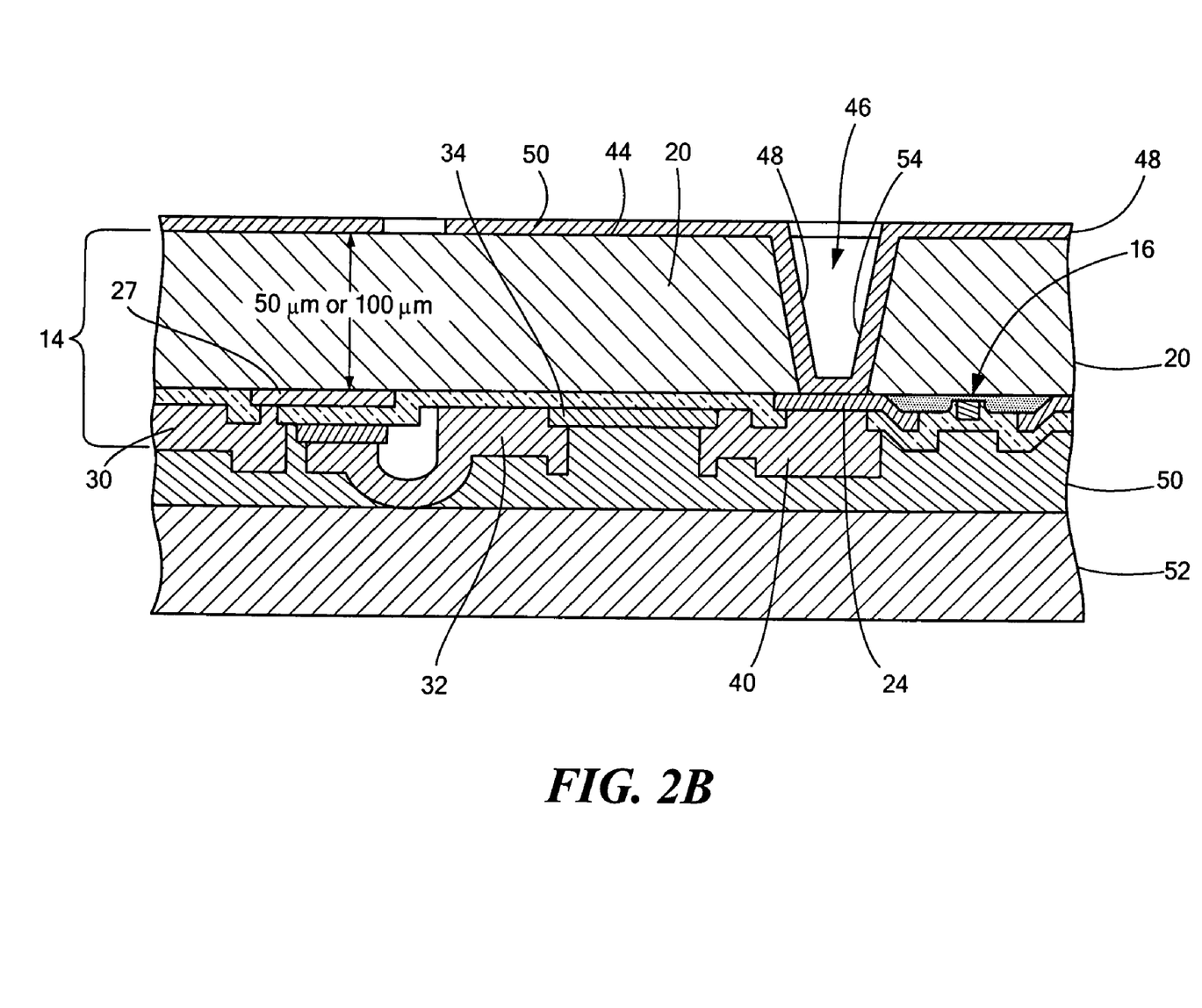
Figure 2C:
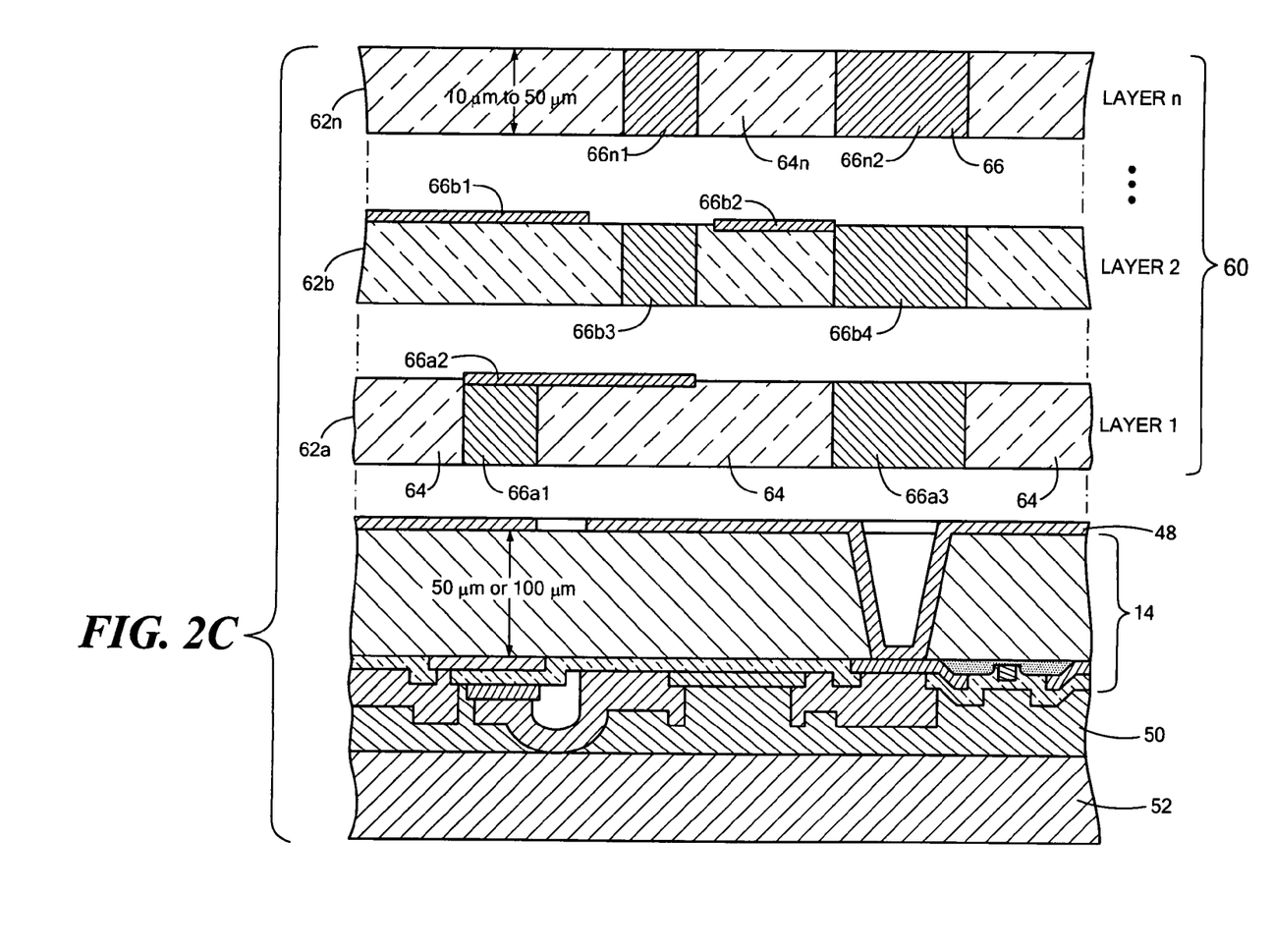

Next, referring to FIG. 2B, the back-side of the chip 14 is processed in any conventional manner. More particularly, a via 46 is formed through the back-side 44 of the chip 14 and an electrical interconnect layer 48 is formed having a first portion 50 thereof disposed on the bottom surface portion of the semiconductor substrate 20. As noted above, the semiconductor substrate 20 has the via 46 therethrough. A second portion 54 of the electrical interconnect 48 pass though the via 46 and is electrically connected to the active device 16, and more particularly to the source/drain contact through the conductor 24.

Next, a layer of conformal material 50, here wax, is disposed on the upper-side of the chip as shown in FIG. 2B. The outer surface of material 50 is then set on the optically flat surface of a single crystal support 52, here sapphire 52.

Figure 2D:
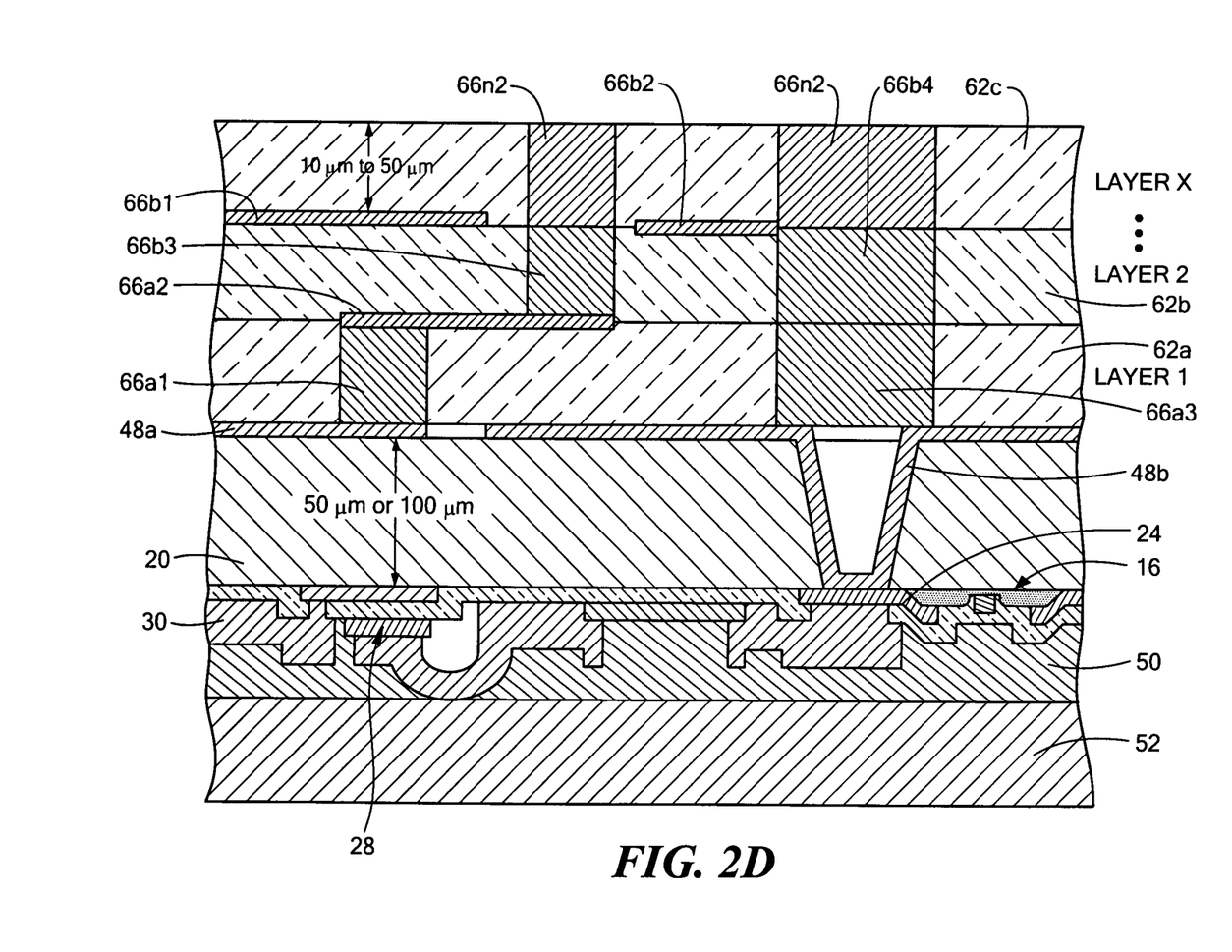

Next, a multilayer interconnect structure 60 is formed on the wafer. More particularly, the multilayer interconnect structure 60 is formed over the interconnect layer 48. The multilayer interconnect structure 60 is formed and patterned, here using photolithographic techniques, as a series, or sequence of layers 62a-62n. The multilayer interconnect structure 60 thus provides a plurality of signal routing sections, each one of the signal routing sections being formed on the bottom surface portion of a corresponding one of the chips 14. Each one of the sections has a plurality of dielectric layers 64a-64n and a plurality of electrical conductors, here shown as electrical conductors 66a1-66a3, 66b1-66b4, and 66n1-66n2, for example. The resulting structure is shown in FIG. 22D.

Here, the electrical conductors 66n2, 66b4 and 66a3 provide thermal conductivity to the active device 16 through the portion 48b of electrical layer 48 and electrical conductor 24. Here, the electrical conductors 66b1 and 66b2 provide ground planes. Here, electrical conductors 66n2, 66a2, 66a1 are electrically connected to conductor portion 48a of interconnect layer 48. Thus, a microwave, here strip transmission line, is provided with conductor 30 as the strip conductor of such transmission line so as to enable rf energy to be coupled to the dc blocking capacitor 28.

Figure 3:
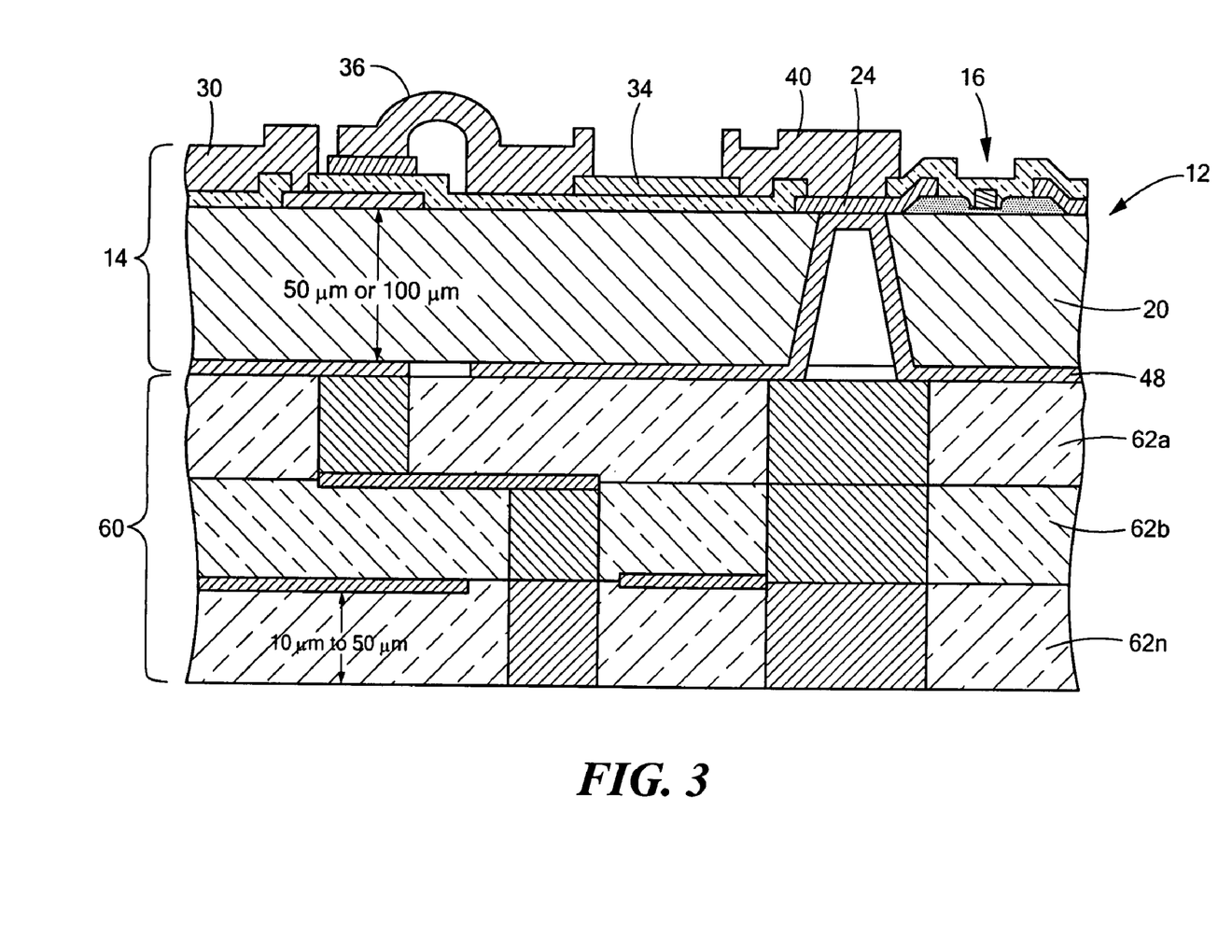
FIG. 3 is a sketch showing the exemplary of one of the semiconductor structures fabricated in FIG. 2A-2D after separation from the semiconductor wafer of FIG. 1.

Next, the support 52 and conformal material 50 are removed. Thus, referring to FIG. 1, each one of the regions 12 has a structured therein as shown in FIG. 3 for an exemplary one of the regions 12.

Next, the individual chips 14 with the corresponding one of the signal routing sections are separated from the wafer.

It should be noted that the invention is most effective when multiple functions, as described above, are integrated. One motivation for this invention is the integration of functions on thin (2 mil or 4 mil) GaAs wafers and the fragility of large MMICs made with that technology. MMICs on the order of 10 mm$^2$ are routinely made and handled for assembly into a subsystem but integrated MMICs that may be as large as 50 mm$^2$ would be too fragile to effectively handle. Also, 2 mil wafer are too fragile to do post processing on such as the multiplayer routing describe herein. A component to this invention is to perform the processing while the thinned wafer is still attached (with wax) to the optically flat sapphire support 52 used in the back-side processing described. Because back-side metal deposition and patterning is already done on wafers, the backside processing of additional layers and patterns can be done while the wafer is still securely attached to the sapphire wafer. The new process does require that the layering material be deposited in accordance to the thermal, chemical and mechanical limits of the wax adhesive. Several material options exist for this such as spin on polymers or sheets of laminate polymers. The exact material would be chosen to meet the application requirements by choosing material parameters such as dielectric constant, thermal expansion coefficient and layer thickness. The integrated MMIC would be mechanically supported by the polymer layers and the wafer could be dice before removing the laminated wafer from the sapphire support 52 as described above. The resulting integrated MMIC would now be suitable for handling in the next level assembly. The number of layers can be as many as required for the functionality but would be limited by mechanical stresses on the MMIC and potential built up tolerances on the polymer layers.

A number of embodiments of the invention have been described. Nevertheless, it will be understood that various modifications may be made without departing from the spirit and scope of the invention. Accordingly, other embodiments are within the scope of the following claims.

What is claimed is:

1. A method for forming a semiconductor structure, comprising:
   providing a single crystal wafer, such wafer having a plurality of MMIC chips, each one of the chips having:
      an active device formed in a first surface portion of a semiconductor substrate provided by the wafer and an electrical interconnect having a first portion thereof disposed on a second surface portion of the semiconductor substrate, such first surface portion and such second surface portion being on opposite surfaces of the substrate, such semiconductor substrate having a via therethrough, a second portion of the electrical interconnect passing through the via and being electrically connected to the active device;
   forming a multilayer interconnect structure on the wafer, such multilayer interconnect structure having a plurality of signal routing sections, each one of the signal routing sections being formed on the second surface portion of a corresponding one of the chips, each one of the sections having a plurality of dielectric layers and a plurality of electrical conductors, at least one of the electrical conductors being electrically coupled to the active device to route an electrical signal to such active device, separating each one of the plurality of chips and the corresponding one of the signal routing sections from the wafer.

2. The method recited in claim 1 wherein the multilayer interconnect structure is formed with a portion of the electrical conductors and dielectric layers providing a thermal conductor between a region exterior of the wafer and a region in thermal contact with the active device.

3. The method recited in claim 1 wherein the multilayer interconnect structure is formed with a portion of the electrical conductors and dielectric layers providing a ground plane portion of a microwave transmission circuit for coupling microwave energy to or from the active device.

4. The method recited in claim 3 wherein the multilayer interconnect structure is formed with a portion of the electrical conductors and dielectric layers providing a thermal conductor between a region exterior of the wafer and a region in thermal contact with the active device.

5. The method recited in claim 1 wherein the multilayer interconnect structure forming comprises forming and processing the plurality of electrical conductors and dielectric layer on the wafer while the plurality of electrical conductors and dielectric layers are disposed on the second surface portion of the plurality of chips.

6. The method recited in claim 5 wherein the processing comprises a photolithographic process.

7. The method recited in claim 1 including:
applying a layer of a conformal material over the first surface portion;
disposing a single crystal support on the conformal material; and
forming the multilayer interconnect structure on the single crystal support.

8. The method recited in claim 7 wherein the single crystal support is sapphire.

9. The method recited in claim 8 wherein the conformal material is wax.

10. The method recited in claim 7 wherein the multilayer interconnect structure forming comprises forming and processing the plurality of electrical conductors and dielectric layer on the wafer while the plurality of electrical conductors and dielectric layers are disposed on the second surface portion of the plurality of chips.

* * * * *

UNITED STATES PATENT AND TRADEMARK OFFICE
CERTIFICATE OF CORRECTION

PATENT NO. : 7,387,958 B2
APPLICATION NO. : 11/177732
DATED : June 17, 2008
INVENTOR(S) : McCarroll et al.

It is certified that error appears in the above-identified patent and that said Letters Patent is hereby corrected as shown below:

On the Title Page Item (57) Abstract, line 7 delete "though" and replace with --through--.

Col. 1, line 41, delete "system." and replace with --a system.--.

Col. 1, line 63, delete "though" and replace with --through--.

Col. 2, line 21, delete "layer" and replace with --layers--.

Col. 2, line 43, delete "d.c." and replace with --DC--.

Col. 2, line 44, delete "r.f." and replace with --RF--.

Col. 2, line 45, delete "formed" and replace with --form--.

Col. 2, line 62, delete "cross sectional; sketch" and replace with --cross-sectional sketches--.

Col. 3, line 2, delete "FIG. 2A-2D" and replace with --FIGS. 2A-2D--.

Col. 3, line 27, delete "shown" and replace with --should--.

Col. 3, line 39, delete "interconnect 48 pass though" and replace with --interconnect layer 48 passes through--.

Col. 4, line 2, delete "rf" and replace with --RF--.

Col. 4, line 3, delete "dc" and replace with --DC--.

Col. 4, line 6, delete "structured" and replace with --structure--.

Col. 4, line 18, delete "wafer" and replace with --wafers--.

Col. 4, line 24, delete "backside" and replace with --back-side--.

Col. 4, line 35, delete "dice" and replace with --diced--.

UNITED STATES PATENT AND TRADEMARK OFFICE
CERTIFICATE OF CORRECTION

PATENT NO. : 7,387,958 B2
APPLICATION NO. : 11/177732
DATED : June 17, 2008
INVENTOR(S) : McCarroll et al.

It is certified that error appears in the above-identified patent and that said Letters Patent is hereby corrected as shown below:

Col. 6, line 1, delete "layer" and replace with --layers--.

Col. 6, line 20, delete "layer" and replace with --layers--.

Signed and Sealed this

Tenth Day of February, 2009

JOHN DOLL
*Acting Director of the United States Patent and Trademark Office*